United States Patent
Chou

(10) Patent No.: US 9,405,620 B2
(45) Date of Patent: Aug. 2, 2016

(54) DATA STORAGE DEVICE AND ERROR CORRECTION METHOD THEREOF

(71) Applicant: Silicon Motion, Inc., Jhubei (TW)

(72) Inventor: Po-Sheng Chou, Toufen Township (TW)

(73) Assignee: Silicon Motion, Inc., Jhubei (TW)

( * ) Notice: Subject to any disclaimer, the term of this patent is extended or adjusted under 35 U.S.C. 154(b) by 69 days.

(21) Appl. No.: 14/562,328

(22) Filed: Dec. 5, 2014

(65) Prior Publication Data

US 2015/0188575 A1 Jul. 2, 2015

(30) Foreign Application Priority Data

Dec. 27, 2013 (TW) .............................. 102148613 A

(51) Int. Cl.
| | | |
|---|---|---|
| *G11C 29/00* | (2006.01) | |
| *G06F 11/10* | (2006.01) | |
| *H03M 13/35* | (2006.01) | |
| *H03M 13/37* | (2006.01) | |
| *H03M 13/11* | (2006.01) | |
| *H03M 13/15* | (2006.01) | |

(52) U.S. Cl.
CPC ........ *G06F 11/1068* (2013.01); *G06F 11/1012* (2013.01); *H03M 13/356* (2013.01); *H03M 13/3707* (2013.01); *H03M 13/1102* (2013.01); *H03M 13/152* (2013.01)

(58) Field of Classification Search
None
See application file for complete search history.

(56) References Cited

U.S. PATENT DOCUMENTS

| | | | | |
|---|---|---|---|---|
| 2010/0002506 A1* | 1/2010 | Cho | ................... | G11C 11/5628 365/185.03 |
| 2011/0219284 A1 | 9/2011 | Uchikawa et al. | | |
| 2011/0299335 A1* | 12/2011 | Lee | ................... | G11C 11/5628 365/185.03 |
| 2012/0216096 A1* | 8/2012 | Seo | ........................ | H03M 7/30 714/763 |
| 2013/0019051 A1* | 1/2013 | Somanache | ......... | G06F 12/0246 711/103 |
| 2013/0198589 A1* | 8/2013 | Choi | ................... | G06F 11/1072 714/773 |
| 2015/0012794 A1* | 1/2015 | Losh | ................... | G06F 11/1008 714/755 |
| 2015/0149852 A1* | 5/2015 | Seo | ........................ | H03M 7/30 714/755 |

FOREIGN PATENT DOCUMENTS

WO 2012106255 A1 8/2012

* cited by examiner

*Primary Examiner* — M. Mujtaba K Chaudry
(74) *Attorney, Agent, or Firm* — Wang Law Firm, Inc.

(57) ABSTRACT

A data storage device including a flash memory and a controller. The controller is configured to perform a first error correction on at least one first data sector of a first page of the flash memory when a predetermined condition is satisfied, obtain a data-sector read voltage of the first data sector through the first error correction, retrieve data of a first meta-data sector of the first page by the data-sector read voltage, and perform a second error correction on the retrieved data of the first meta-data sector read by the data-sector read voltage.

15 Claims, 5 Drawing Sheets

DATA STORAGE DEVICE AND ERROR CORRECTION METHOD THEREOF

CROSS REFERENCE TO RELATED APPLICATIONS

This Application claims priority of Taiwan Patent Application No. 102148613, filed on Dec. 27, 2013, the entirety of which is incorporated by reference herein.

BACKGROUND OF THE INVENTION

1. Field of the Invention

The present invention relates to an error correction method applied to a memory device, and in particular to an error correction method having two error corrections.

2. Description of the Related Art

Flash memory is considered a non-volatile data storage device, using electrical methods to erase and program itself. Taking NAND Flash as an example, it is often used in memory cards, USB flash devices, solid state devices, eMMC and other uses.

Flash memory such as NAND Flash uses a multiple-block structure to store data, wherein the flash memory is constructed by floating gate transistors. The floating gates of the floating gate transistors may catch electric charges for storing data. However, the floating gates may lose the electronic charges due to various operations and the various environmental parameters of the flash memory, which can lead to read and write errors.

BRIEF SUMMARY OF THE INVENTION

A detailed description is given in the following embodiments with reference to the accompanying drawings.

The present invention provides a data storage device including a flash memory and a controller. The controller is configured to perform a first error correction on at least one first data sector of a first page of the flash memory when a predetermined condition is satisfied, obtain a data-sector read voltage of the first data sector through the first error correction, retrieve data of a first meta-data sector of the first page by the data-sector read voltage, and perform a second error correction on the retrieved data of the first meta-data sector read by the data-sector read voltage.

The present invention further provides an error correction method applied to a data storage device. The error correction method includes performing a first error correction on at least one first data sector of a first page of a flash memory of the data storage device to obtain the data-sector read voltage of the first data sector; retrieving data of a first meta-data sector of the first page by the data-sector read voltage; and performing a second error correction on the retrieved data of the first meta-data sector read by the data-sector read voltage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
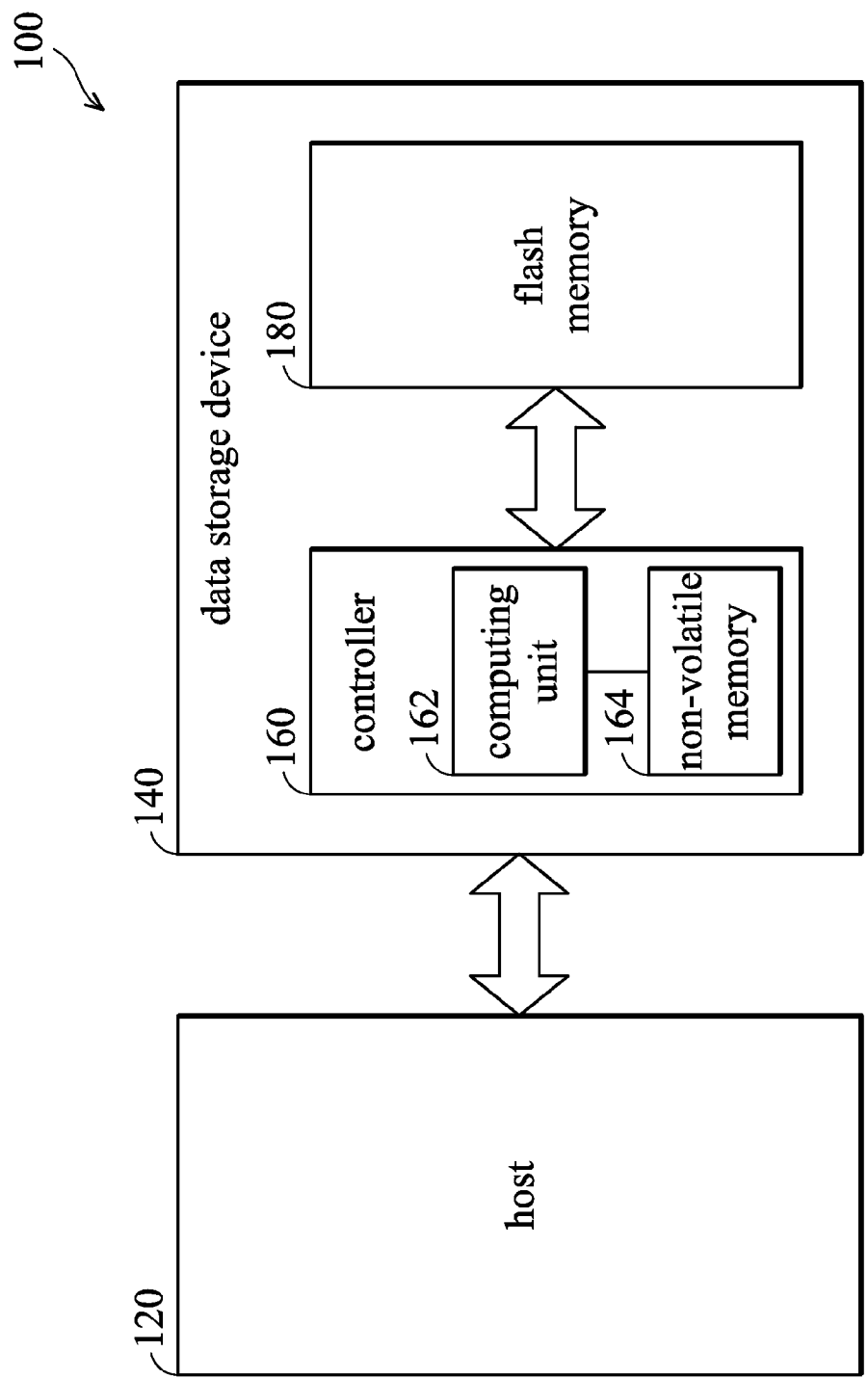
FIG. 1 is a schematic diagram illustrating an electronic system according to an exemplary embodiment.

FIG. 1 is a schematic diagram illustrating an electronic system according to an exemplary embodiment. The electronic system 100 includes a host 120 and a data storage device 140. The data storage device 140 includes a flash memory 180 and a controller 160, wherein the data storage device 140 is configured to operate in response to the commands of the host 110.

The controller 160 includes a computing unit 162 and a non-volatile memory 164, such as read-only memory (ROM). The program code and data stored in the nonvolatile memory 164 may constitute firmware, and may be performed by the computing unit 162, such that the controller 160 may control the flash memory 180 by the firmware. The computing unit 162 further includes a first error correction engine and a second error correction engine. The first error correction engine is arranged to perform a first error correction on the retrieved data of the data sector when the data of the retrieved data sector is not correct. The second error correction engine is arranged to perform a second error correction on the data of the meta-data sector when the data of the meta-data sector is not correct. It should be noted that the coding method and the algorithm of the first error correction is different from those of the second error correction. Moreover, the first error correction engine and the second error correction engine may be implemented outside of the computing unit 162 or implemented in the computing unit 162, but it is not limited thereto.

The flash memory 180 includes a plurality of pages. Moreover, the flash memory 180 further includes a plurality of word lines and a plurality of bit lines, wherein each of word lines is arranged to be connected to at least one page, and the word lines are arranged to select the target page. If the flash memory 180 is Multi-Level Cell (MLC) flash memory, each of the bit lines of the flash memory 180 is arranged to be coupled to two pages. If the flash memory 180 is Triple-Level Cell (TLC) flash memory, each of the bit lines of the flash memory 180 is arranged to be coupled to three pages, but it is not limited thereto. Each of the pages includes a plurality of data sectors and at least one meta-data sector arranged to store the corresponding meta data, but it is not limited thereto. Each of the pages may have one meta-data sector, two meta-data sectors or three meta-data sectors, but it is not limited thereto. Moreover, each of the pages may include one data sector, four data sectors or eight data sectors, but it is not limited thereto.

Figure 2A:
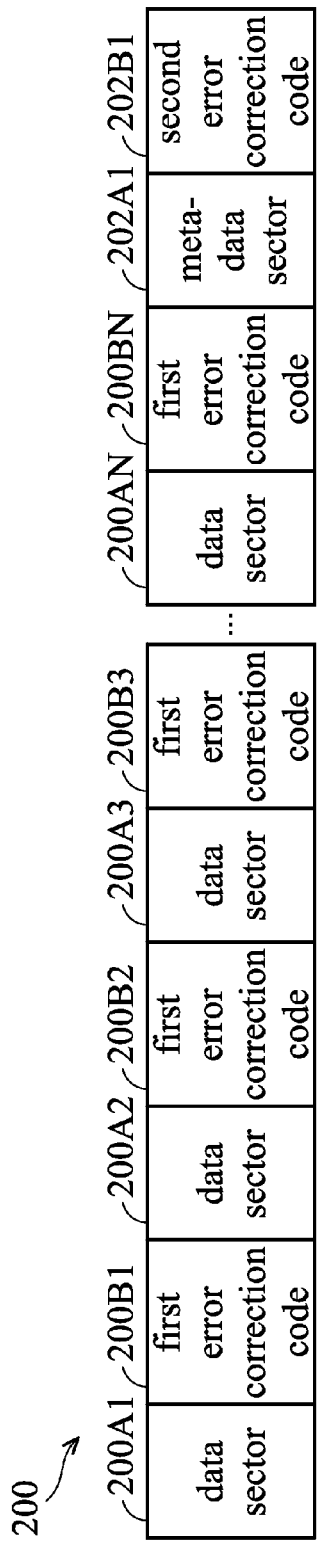
FIG. 2A is a schematic diagram illustrating a page according to an exemplary embodiment.
Figure 2B:
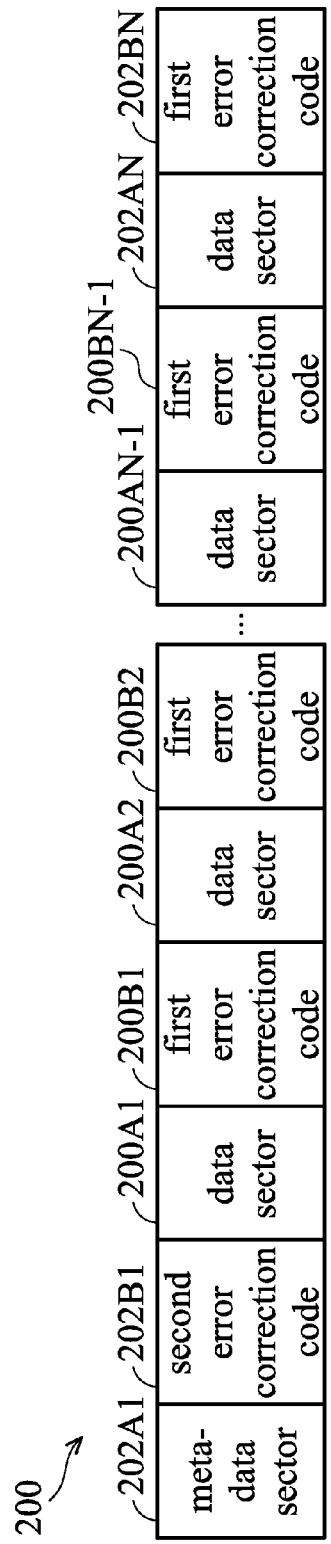
FIG. 2B is a schematic diagram illustrating a page according to another exemplary embodiment.

As shown in FIG. 2A and FIG. 2B, the page 200 includes a plurality of data sectors 200A1-200AN and a meta-data sector 202A1. The data sectors 200A1-200AN have the corresponding first error correction codes 200B1-200BN. The meta-data sector 202A1 has a second error correction code 202B1. It should be noted that the first error correction codes 200B1-200BN and the second error correction code 202B1 are different. The first error correction codes 200B1-200BN are arranged to perform the first error correction on the corresponding data sectors 200A1-200AN. The second error correction code 202B1 is arranged to perform the second error correction on the meta-data sector 202A1. Moreover, the meta-data sector 202A1 may be implemented in the front end of the page 200, as shown in FIG. 2A. In another embodiment, the meta-data sector 202A1 may be implemented in the back end of the page 200, as shown in FIG. 2B. In other embodiment, the meta-data sector 202A1 may be implemented in the middle of the page 200 (not shown), but it is not limited thereto. in other embodiment, one page may have more than two meta-data sectors. Moreover, the meta-data sector 202A1 is arranged to store the information of the data sectors 200A1-200AN, such as address, indexes, etc., but it is not limited thereto.

In one embodiment, the first error correction engine is a LDPC engine (Low-density parity-check code engine), and the second error correction engine is a BCH engine. In this embodiment, the first error correction code is the LDPC error correction code, and the second error correction code is the BCH error correction code, but it is not limited thereto. It should be noted that the LDPC error correction engine is arranged to use a plurality of Gaussian distribution levels (N2, N4, N6, N8, etc.) to track the read voltage value which can correctly read the data sector in the process of the LDPC error correction. The BCH engine is arranged to correct the error of the data according to the reference cell or a plurality of different read voltages stored in a read-retry table. The circuit of the LDPC error correction is more complicated and more expensive than the circuit of the BCH error correction. Furthermore, the LDPC error correction has better error correction ability than the BCH error correction. The read voltage shifts with the surrounding environment, and the shift values of the read voltages of the pages and sectors which are coupled with and controlled by the same word line are similar due to the physical properties of the flash memory 180. Therefore, in this embodiment, the error correction of the bigger data sector (i.e. 1K) is performed by the LDPC error correction engine, and the error correction of the smaller data sector (i.e. 16, 24 or 32 Bytes) is performed by the BCH engine.

The controller 160 is configured to use the corresponding LDPC error correction code (first error correction code) to perform the LDPC error correction (first error correction) on the at least one first data sectors 200A1-200AN of a first page 200 of the flash memory 180 when a predetermined condition is satisfied, and obtain a data-sector read voltage corresponding to the first data sector 200A1-200AN by the data-sector read voltage. Next, the controller 160 is further configured to read the meta-data sector 202A1 of the first page 200 by the data-sector read voltage, and use the corresponding BCH error correction code (second error correction code) to perform the BCH error correction (second error correction) on the data of the meta-data sector 202A1 retrieved by the data-sector read voltage.

In one embodiment, the predetermined condition is that the controller 160 cannot successfully correct the data of the meta-data sector 202A1 retrieved by a predetermined read voltage by the BCH error correction (second error correction). More specifically, when the controller 160 receives a read command or the command arranged to update the physical/logical mapping table of pages and/or blocks, the controller 160 may have to retrieve the data of the meta-data sectors of at least one page, such as the meta-data sector 202A1 of the page 200. Therefore, the controller 160 retrieves the data of the meta-data sector 202A1 by the predetermined read voltage corresponding to the meta-data sector 202A1, and enables the BCH engine to use the BCH error correction code (second error correction code) to perform the BCH error correction (second error correction) on the data of the meta-data sector 202A1 retrieved by the predetermined read voltage. When the BCH error correction cannot successfully correct the retrieved data, which is retrieved by the predetermined read voltage, of the meta-data sector 202A1, the controller 160 is configured to enable the LDPC error correction engine to use the corresponding LDPC error correction code (first error correction code) to perform the LDPC error correction (first error correction) on at least one of the data sectors 200A1-200AN which is connected with the same word line as the meta-data sector 202A1, but it is not limited thereto.

In another embodiment, the flash memory 180 further includes a read-retry table arranged to store a plurality of read-retry-voltage sets corresponding to respective meta-data sectors. The predetermined condition in this embodiment is that the controller 160 cannot successfully correct the data of the meta-data sector 202A1 which is retrieved by the predetermined read voltage by the BCH error correction (second error correction) and also cannot successfully correct the data of the meta-data sector 202A1 which is retrieved by the read-retry-voltage set by the LDPC error correction (second error correction). More specifically, when the controller 160 receives a read command arranged to read the first page 200 or the command arranged to update the physical/logical mapping table of pages and/or blocks, the controller 160 may have to retrieve the data of the meta-data sectors of at least one page, such as the meta-data sector 202A1 of the page 200. Therefore, the controller 160 retrieves the data of the meta-data sector 202A1 by the predetermined read voltage corresponding to the meta-data sector 202A1, and enables the BCH engine to use the BCH error correction code (second error correction code) to perform the BCH error correction (second error correction) on the data of the meta-data sector 202A1 retrieved by the predetermined read voltage. When the BCH error correction cannot successfully correct the retrieved data, which is retrieved by the predetermined read voltage, of the meta-data sector 202A1, the controller 160 is configured to repeatedly retrieve the data of the meta-data sector 202A1 according to the read voltages of the read-retry-voltage set corresponding to the meta-data sector 202A1 of the read-retry table, respectively, and enable the BCH engine to use the BCH error correction code (second error correction code) to correct the retrieved data. When the BCH engine cannot successfully correct any of the data of the meta-data sector 202A1 retrieved by the read voltages of the read-retry-voltage set of the read-retry table the controller 160 is configured to enable the LDPC error correction engine to use the LDPC error correction code (first error correction code) to perform the LDPC error correction (first error correction) on at least one of the data sectors 200A1-200AN connected with the same word line as the meta-data sector 202A1.

It should be noted that, in one embodiment, the LDPC error correction engine is configured to perform the LDPC error correction (first error correction) on a specific data sector, wherein the specific data sector is one of the data sectors connected with the same word line as the meta-data sector 202A1, and the specific data sector is the one which is most close to the meta-data sector 202A1 of the data sectors which is connected with the same word line as the meta-data sector 202A1. For example, in the embodiment of FIG. 2A, the LDPC error correction engine is configured to use the LDPC error correction code 200BN to perform the LDPC error correction (first error correction) on the data sector 200AN. In the embodiment of FIG. 2B, the LDPC error correction engine is configured to use the LDPC error correction code 200B1 to perform the LDPC error correction (first error correction) on the data sector 200A1, but it is not limited thereto. In another embodiment, the LDPC error correction engine is arranged to perform the LDPC error correction (first error correction) on all of the data sectors 200A1-200AN of the page to obtain the read voltages of the data sectors 200A1-200AN, and determine the data-sector read voltage from the obtained read voltages by a predetermined algorithm. For example, the data-sector read voltage can be the average of the obtained read voltages, but it is not limited thereto.

Figure 3:
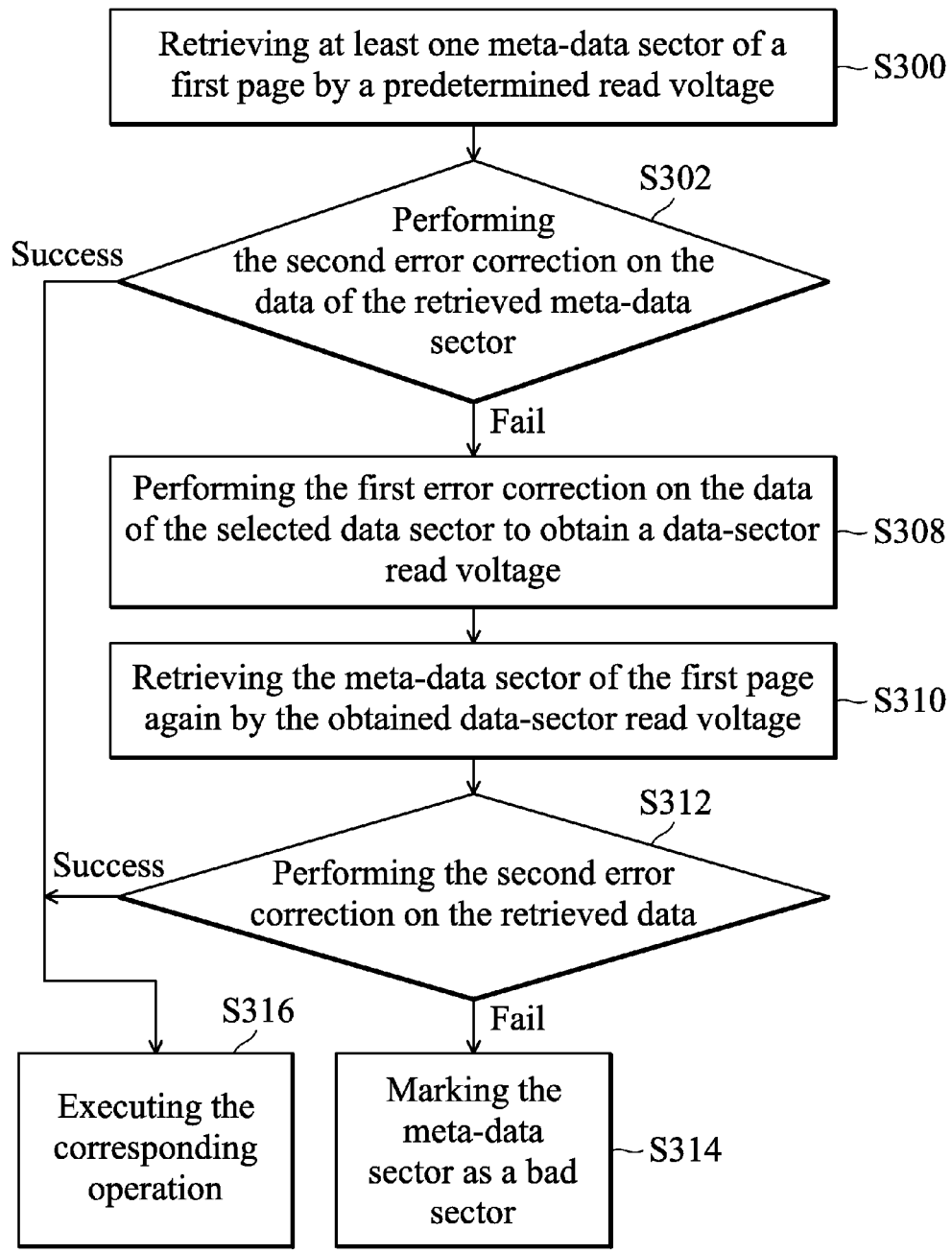
FIG. 3 is a flowchart of an error correction method according to an exemplary embodiment.

FIG. 3 is a flowchart of an error correction method according to an exemplary embodiment. The error correction method is applied to the data storage device 140 of FIG. 1. The process starts at step S300.

In step S300, the controller 160 is configured to retrieve at least one meta-data sector 200B1 of a first page 200 by a predetermined read voltage. More specifically, when the controller 160 receives a read command arranged to read the first page 200 or the command is arranged to update the physical/logical mapping table of pages and/or blocks, the controller 160 may have to retrieve the data of the meta-data sectors of at least one page, such as meta-data sector 202A1 of page 200. Therefore, the controller 160 retrieves the data of the meta-data sector 202A1 by the predetermined read voltage corresponding to the meta-data sector 202A1. Moreover, the predetermined read voltage can be determined by the current on the reference cell of the meta-data sector 200B1, but it is not limited thereto.

Next, in step S302, the controller 160 is configured to enable the BCH engine to use the BCH error correction code (second error correction code) to perform the BCH error correction (second error correction) on the data of the meta-data sector 202A1 which is retrieved by the predetermined read voltage in step S300. When the BCH error correction cannot successfully correct the data of the meta-data sector 202A1 which is retrieved by the predetermined read voltage, the process goes to step S308, otherwise, the process goes to step S316.

In step S308, the controller 160 is configured to enable the LDPC error correction engine to use the corresponding LDPC error correction code (first error correction code) to perform the LDPC error correction (first error correction) on the data of the selected data sector of the data sectors 200A1-200AN to obtain a data-sector read voltage corresponding to the selected data sector. In one embodiment, the LDPC error correction engine is configured to perform the LDPC error correction (first error correction) on the data sector which is connected with the same word line as the meta-data sector 202A1 and which is closest to the meta-data sector 202A1. For example, in the embodiment of FIG. 2A, the LDPC error correction engine is configured to use the LDPC error correction code 200BN to perform the LDPC error correction (first error correction) on the data sector 200AN. In the embodiment of FIG. 2B, the LDPC error correction engine is configured to use the LDPC error correction code 200B1 to perform the LDPC error correction (first error correction) on the data sector 200A1, but it is not limited thereto. In another embodiment, the LDPC error correction engine is arranged to perform the LDPC error correction (first error correction) on all of the data sectors 200A1-200AN of the page to obtain the read voltages of the data sectors 200A1-200AN, and determine the data-sector read voltage from the obtained read voltages by a predetermined algorithm. For example, the data-sector read voltage can be the average of the obtained read voltages, but it is not limited thereto.

Next, in step S310, the controller 160 is configured to retrieve the meta-data sector 202A1 of the first page 200 again by the obtained data-sector read voltage.

Next, in step S312, the controller 160 is configured to enable the BCH engine to use the BCH error correction code (second error correction code) to perform the BCH error correction (second error correction) on the data of the meta-data sector 202A1 which is retrieved by the data-sector read voltage. When the BCH error correction cannot successfully correct the data of the meta-data sector 202A1 which is retrieved by the data-sector read voltage, the process goes to step S314, otherwise, the process goes to step S316.

In step S314, the controller 160 is configured to mark the meta-data sector 202A1 as a bad sector. The process end at step S314.

In step S316, the controller is configured to use the data which is successfully read to execute the corresponding operation. The process ends at step S316.

Figure 4A:
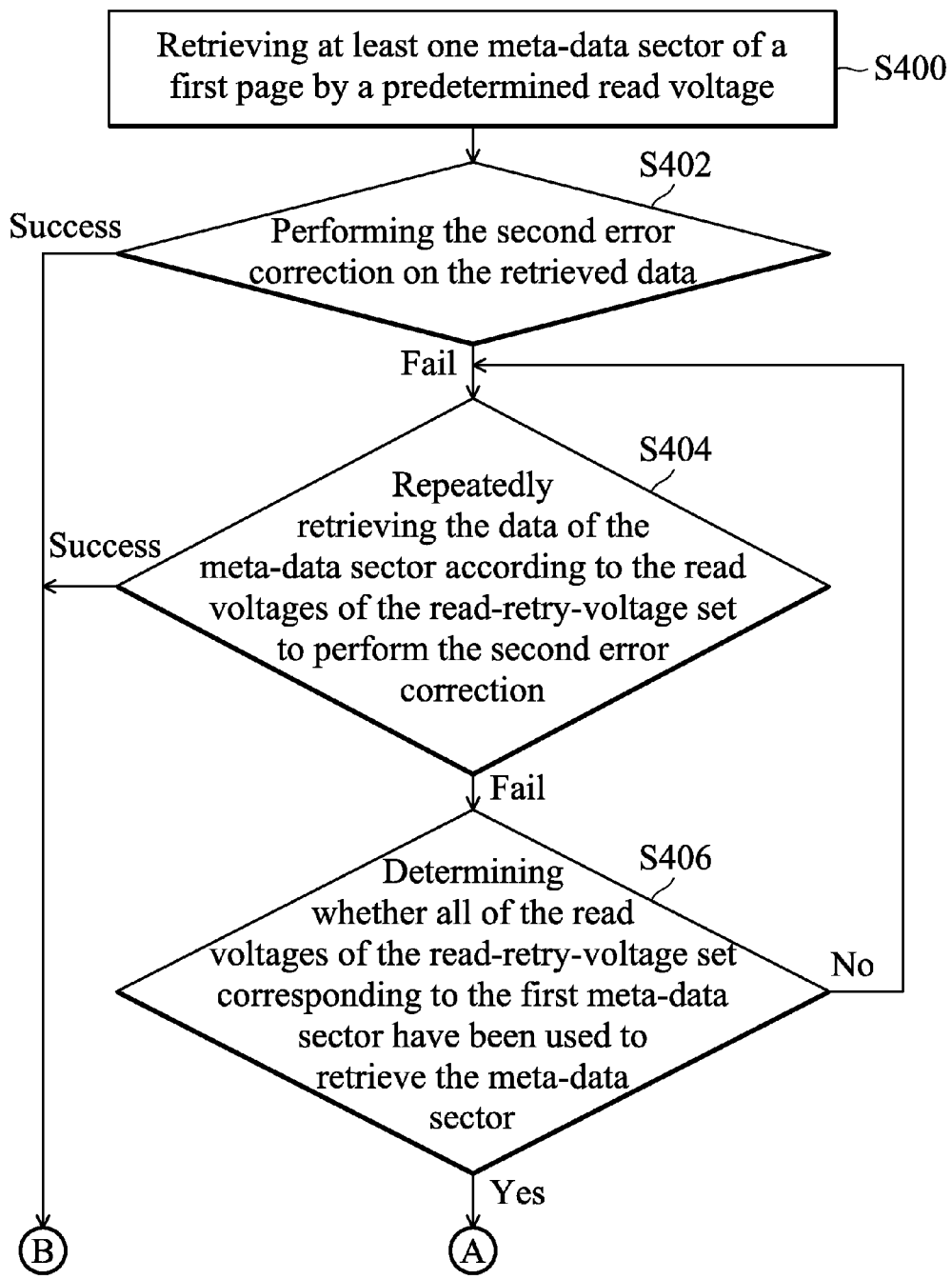
FIGS. 4A-4B is a flowchart of an error correction method according to another exemplary embodiment.
Figure 4B:
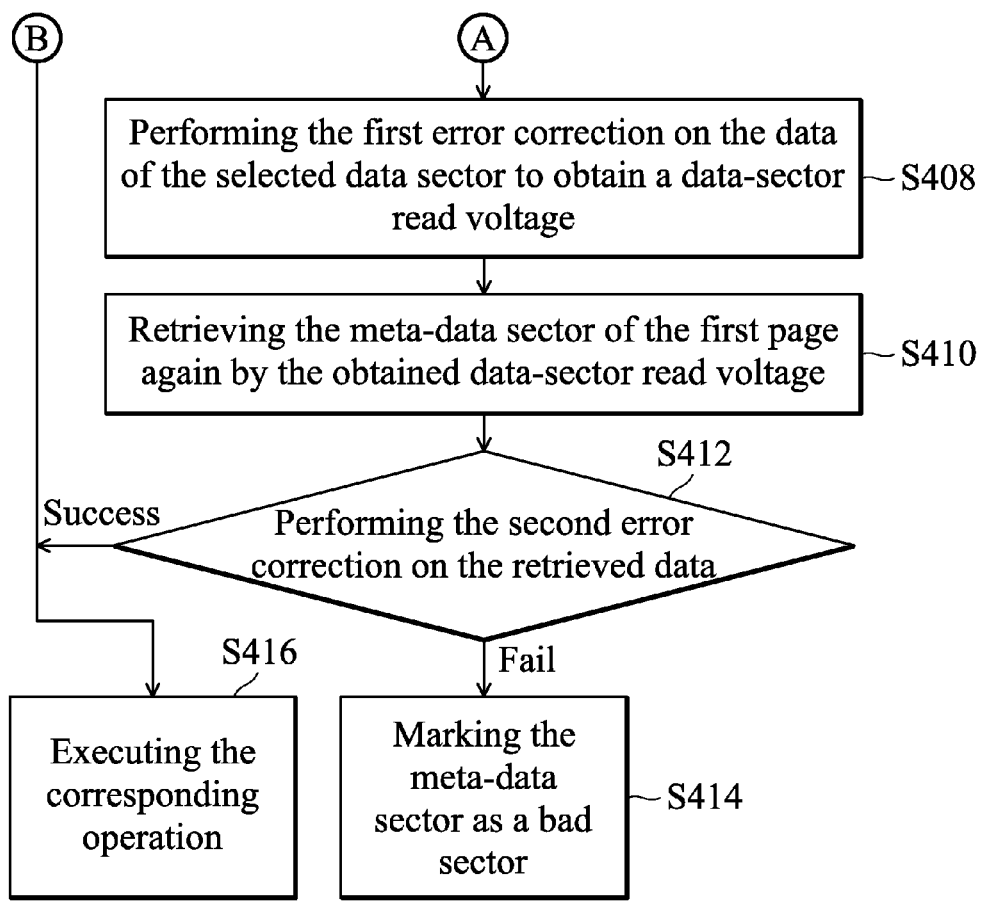

FIGS. 4A-4B is a flowchart of an error correction method according to another exemplary embodiment. The error correction method is applied to the data storage device 140 of FIG. 1. The process starts at step S400. It should be noted that the steps S400 and S408-S414 are similar to steps S300 and S308-S314 of FIG. 3. Therefore, the details of steps S400 and S408-S414 can be referred to in the description of steps S300 and S308-S314 of FIG. 3.

In step S402, the controller 160 is configured to enable the BCH engine to use the BCH error correction code (second error correction code) to perform the BCH error correction (second error correction) on the data of the meta-data sector 202A1 which is retrieved by the predetermined read voltage. When the BCH error correction cannot successfully correct the data of the meta-data sector 202A1 retrieved by the predetermined read voltage, the process goes to step S404, otherwise, the process goes to step S416.

In step S404, the controller 160 is configured to repeatedly retrieve the data of the meta-data sector 202A1 according to the read voltages of the read-retry-voltage set corresponding to the meta-data sector 202A1 of the read-retry table, respectively to perform the BCH error correction (second error correction). When the BCH error correction cannot successfully correct the data of the meta-data sector 202A1 retrieved by the voltages of the read-retry-voltage set, the process goes to step S406, otherwise, the process goes to step S416.

In step S406, the controller 160 is configured to determine whether all of the read voltages of the read-retry-voltage set corresponding to the first meta-data sector 202A1 have been used to retrieve the meta-data sector 202A1. When all of the read voltages of the read-retry-voltage set have been used, the process goes to step S408, otherwise, the process returns to step S404, and the controller 160 continuous to repeatedly retrieve the data of the meta-data sector 202A1 according to the read voltages of the read-retry-voltage set corresponding to the meta-data sector 202A1 of the read-retry table, respectively to perform the BCH error correction (second error correction).

The data storage device 140 of the exemplary embodiments can use two error correction algorithms to correct the data.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory; and
   a controller, configured to perform a first error correction on at least one first data sector of a first page of the flash memory when a predetermined condition is satisfied, obtain a data-sector read voltage of the first data sector through the first error correction, retrieve data of a first meta-data sector of the first page by the data-sector read voltage, and perform a second error correction on the retrieved data of the first meta-data sector read by the data-sector read voltage.

2. The data storage device as claimed in claim 1, wherein the coding method and algorithm of the first error correction is different from the second error correction.

3. The data storage device as claimed in claim 2, wherein the first error correction is Low-density parity-check code (LDPC) error correction, and the second error correction is BCH error correction.

4. The data storage device as claimed in claim 3, wherein the controller further comprises an LDPC engine and a BCH engine.

5. The data storage device as claimed in claim 2, wherein the flash memory further comprises a plurality of pages, each of the pages comprises a plurality of data sectors and at least one meta-data sector, each of the data sectors has a first error correction code arranged to perform the first error correction, and each of the meta-data sectors has a second error correction code arranged to perform the second error correction, wherein the first page is included in the pages.

6. The data storage device as claimed in claim 5, wherein the first error correction code is LDPC error correction code, and the second error correction code is BCH error correction code.

7. The data storage device as claimed in claim 1, wherein the predetermined condition is that the controller cannot successfully correct the data of the first meta-data sector retrieved by a predetermined read voltage by the second error correction.

8. The data storage device as claimed in claim 7, wherein the flash memory further comprises a read-retry table arranged to store a plurality of read-retry-voltage sets corresponding to the meta-data sectors, and the predetermined condition further comprises that the controller cannot successfully correct the data of the first meta-data sector retrieved by the read-retry-voltage set corresponding to the first meta-data sector by the second error correction.

9. A error correction method, applied to a data storage device, comprising:
   performing a first error correction on at least one first data sector of a first page of a flash memory of the data storage device to obtain a data-sector read voltage of the first data sector;
   retrieving data of a first meta-data sector of the first page by the data-sector read voltage; and
   performing a second error correction on the retrieved data of the first meta-data sector read by the data-sector read voltage.

10. The error correction method as claimed in claim 9, wherein the coding method and algorithm of the first error correction is different from the second error correction.

11. The error correction method as claimed in claim 10, wherein the first error correction is Low-density parity-check code (LDPC) error correction, and the second error correction is BCH error correction.

12. The error correction method as claimed in claim 11, wherein the flash memory further comprises a plurality of pages, each of the pages comprises a plurality of data sectors and at least one meta-data sector, each of the data sectors has a first error correction code arranged to perform the first error correction, each of the meta-data sectors has a second error correction code arranged to perform the second error correction, wherein the first page is included in the pages.

13. The error correction method as claimed in claim 12, wherein the first error correction code is LDPC error correction code, and the second error correction code is BCH error correction code.

14. The error correction method as claimed in claim 9, further comprising:
   retrieving at least one first meta-data sector of the first page by a predetermined read voltage;
   performing the second error correction on the data of the first meta-data sector retrieved by a predetermined read voltage; and
   performing the step of performing the first error correction on the first data sector when the second error correction cannot correct the data of the first meta-data sector retrieved by the predetermined read voltage.

15. The error correction method as claimed in claim 9, further comprising:
   retrieving at least one first data sector of the first page by a predetermined read voltage;
   performing the second error correction on the data of the first meta-data sector retrieved by a predetermined read voltage; and
   repeating reading the data of the first meta-data sector by a read-retry-voltage set to perform the second error correction, wherein the read-retry-voltage set is stored in a read-retry table, and corresponds to the first meta-data sector when the second error correction cannot correct the data of the first meta-data sector retrieved by the predetermined read voltage; and
   when the second error correction cannot correct the data of the first meta-data sector by the read-retry-voltage set, performing the step of performing the first error correction on the first data sector.

* * * * *